United States Patent
Oh et al.

(10) Patent No.: US 8,281,064 B2
(45) Date of Patent: Oct. 2, 2012

(54) SYSTEMS, METHODS AND COMPUTER PROGRAM PRODUCTS FOR ENCODING DATA TO BE WRITTEN TO A NONVOLATILE MEMORY BASED ON WEAR-LEVELING INFORMATION

(75) Inventors: Hwa-Seok Oh, Gyeonggi-do (KR); Jin-Hyeok Choi, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 325 days.

(21) Appl. No.: 12/410,150

(22) Filed: Mar. 24, 2009

(65) Prior Publication Data
US 2009/0259803 A1    Oct. 15, 2009

(30) Foreign Application Priority Data
Apr. 15, 2008 (KR) .................. 10-2008-0034765

(51) Int. Cl.
*G06F 12/00* (2006.01)
(52) U.S. Cl. ..................... 711/103; 708/250
(58) Field of Classification Search .............. 711/103
See application file for complete search history.

(56) References Cited

U.S. PATENT DOCUMENTS

| | | | | |
|---|---|---|---|---|
| 5,434,807 A * | 7/1995 | Yoshida | | 708/253 |
| 5,479,638 A * | 12/1995 | Assar et al. | | 711/103 |
| 6,345,001 B1 | 2/2002 | Mokhlesi | | |
| 7,032,087 B1 * | 4/2006 | Chang et al. | | 711/156 |
| 2006/0181934 A1 * | 8/2006 | Shappir et al. | | 365/185.33 |
| 2007/0103992 A1 | 5/2007 | Sakui et al. | | |
| 2007/0136510 A1 | 6/2007 | Ippongi | | |
| 2007/0252738 A1 * | 11/2007 | Nakagawa | | 341/143 |
| 2008/0065812 A1 * | 3/2008 | Li et al. | | 711/103 |

FOREIGN PATENT DOCUMENTS

| | | |
|---|---|---|
| JP | 2007-133541 | 5/2007 |
| JP | 2007-133683 | 5/2007 |
| KR | 1020030051650 A | 6/2003 |
| WO | WO 02/23552 A2 | 3/2002 |

* cited by examiner

*Primary Examiner* — Sanjiv Shah
*Assistant Examiner* — Daniel Tsui
(74) *Attorney, Agent, or Firm* — Myers Bigel Sibley & Sajovec, P.A.

(57) ABSTRACT

A nonvolatile memory system is operated by providing data to be written to a nonvolatile memory, logically combining the data to be written to the nonvolatile memory with a random pattern to generate encoded data; and programming the encoded data in the nonvolatile memory.

18 Claims, 20 Drawing Sheets

E : erase state
P : program state

Dot line : Vth before the charge loss
Solid line : Vth after the charge loss
E : erase state
P : program state Dot line : Vth before the charge loss
Solid line : Vth after the charge loss
E : erase state
P : program state

SYSTEMS, METHODS AND COMPUTER PROGRAM PRODUCTS FOR ENCODING DATA TO BE WRITTEN TO A NONVOLATILE MEMORY BASED ON WEAR-LEVELING INFORMATION

CROSS REFERENCE TO RELATED APPLICATION

This application claims the benefit of and priority to Korean Patent Application No. 2008-34765, filed Apr. 15, 2008, in the Korean Intellectual Property Office, the disclosure of which is hereby incorporated herein by reference as if set forth in its entirety.

BACKGROUND OF THE INVENTION

The present invention relates generally to data processing systems and, more particularly, to the use of storage devices, such as nonvolatile memory systems in data processing systems.

Recently, the number of devices using nonvolatile memories has increased. For example, an MP3 player, a digital camera, a mobile phone, a camcorder, a flash card, and a solid state disk (SSD) are examples of devices that use nonvolatile memories as storage devices.

As more devices use nonvolatile memories as storage devices, the capacity of the nonvolatile memory is generally increasing. One method for increasing memory capacity is use of a so-called multi level cell (MLC) method in which a plurality of bits is stored in one memory cell.

A two-bit MLC may be programmed to have any one of four states 11, 01, 10 and 00 according to distribution of a threshold voltage. Over time, however, cells may be stressed through frequent programming operations and erase operations along with temperature variation. The threshold voltage levels for cells that are programmed and erased more frequently may vary more than the threshold voltage levels for cells that are programmed and erased less frequently. This may result in the threshold voltage levels shifting, which can cause errors in reading the data contained therein.

SUMMARY

According to some embodiments of the present invention, a nonvolatile memory system is operated by providing data to be written to a nonvolatile memory, logically combining the data to be written to the nonvolatile memory with a random pattern to generate encoded data; and programming the encoded data in the nonvolatile memory.

In other embodiments, the method further comprises generating the random pattern based on a reference value.

In still other embodiments, the reference value is associated with a block in the nonvolatile memory into which the encoded data is programmed. The method further comprises changing the reference value when the block in the nonvolatile memory that is associated therewith is erased.

In still other embodiments, the reference value is an erase count value.

In still other embodiments, generating the random pattern comprises operating a plurality of random pattern generators and selecting an output of one of the random pattern generators as the random pattern responsive to the reference value.

In still other embodiments, generating the random pattern comprises operating a random pattern generator to generate the random pattern responsive to a seed value corresponding to the reference value.

In still other embodiments, generating the random pattern comprises providing a plurality of random patterns and selecting one of the random patterns as the random pattern responsive to the reference value.

In still other embodiments, generating the random pattern comprises associating a plurality of data patterns with a plurality of random patterns, respectively, matching the data to be written to the nonvolatile memory to one of the plurality of data patterns, and selecting one of the plurality of random patterns as the random pattern that is associated with the one of the plurality of data patterns that matches the data to be written to the nonvolatile memory.

In still other embodiments, the method further comprises reading the encoded data from the nonvolatile memory and decoding the encoded data using the random pattern.

In still other embodiments, decoding the encoded data comprises decoding the encoded data by logically combining the encoded data with the random pattern.

In still other embodiments, logically combining the data to be written to the nonvolatile memory with a random pattern comprises performing an exclusive-OR operation on the data to be written to the nonvolatile memory and the random pattern and logically combining the encoded data with the random pattern comprises performing an exclusive-OR operation on the encoded data and the random pattern.

In still other embodiments, the data to be written to the nonvolatile memory comprises error correction data.

In still other embodiments, the nonvolatile memory comprises a flash memory.

In further embodiments of the present invention, a nonvolatile memory system is operated by detecting a pattern in data to be written to a nonvolatile memory, encoding the data to be written to the nonvolatile memory based on the detected pattern, and programming the encoded data in the nonvolatile memory.

In still further embodiments, detecting the pattern in data to be written to the nonvolatile memory comprises associating a plurality of data patterns with a plurality of encoded data patterns, respectively and matching the pattern in the data to be written to the nonvolatile memory to one of the plurality of encoded data patterns.

In still further embodiments, encoding the data to be written to the nonvolatile memory comprises selecting one of the plurality of encoded data patterns that is associated with the one of the plurality of data patterns that matches the pattern in the data to be written to the nonvolatile memory as the encoded data.

In still further embodiments, the nonvolatile memory comprises a flash memory.

In other embodiments of the present invention, a memory system comprises a nonvolatile memory and a memory controller that is configured to logically combine data to be written to the nonvolatile memory with a random pattern to generate encoded data and to program the encoded data in the nonvolatile memory.

In still other embodiments, the memory controller is further configured to generate the random pattern based on a reference value.

In still other embodiments, the reference value is associated with a block in the nonvolatile memory into which the encoded data is programmed, the memory controller being further configured to change the reference value when the block in the nonvolatile memory that is associated therewith is erased.

In still other embodiments, the reference value is an erase count value.

In still other embodiments, the memory controller comprises a plurality of random pattern generators and a selector that is configured to select an output of one of the random pattern generators as the random pattern responsive to the reference value.

In still other embodiments, the memory controller comprises a random pattern generator that is operable to generate the random pattern responsive to a seed value corresponding to the reference value.

In still other embodiments, the memory controller comprises a local memory having a plurality of random patterns stored thereon and a selector that is configured to select one of the random patterns as the random pattern responsive to the reference value.

In still other embodiments, the memory controller comprises a local memory having a plurality of data patterns associated with a plurality of random patterns, respectively, stored thereon and a pattern detector that is configured to match the data to be written to the nonvolatile memory to one of the plurality of data patterns. The memory controller is configured to select one of the plurality of random patterns as the random pattern that is associated with the one of the plurality of data patterns that matches the data to be written to the nonvolatile memory.

In still other embodiments, the memory controller is further configured to read the encoded data from the nonvolatile memory and to decode the encoded data using the random pattern.

In still other embodiments, the memory controller is further configured to decode the encoded data by logically combining the encoded data with the random pattern.

In still other embodiments, the memory controller is further configured to logically combine the data to be written to the nonvolatile memory with a random pattern by performing an exclusive-OR operation on the data to be written to the nonvolatile memory and the random pattern and to logically combine the encoded data with the random pattern by performing an exclusive-OR operation on the encoded data and the random pattern.

In still other embodiments, the data to be written to the nonvolatile memory comprises error correction data.

In still other embodiments, the nonvolatile memory comprises a flash memory.

In still other embodiments, the memory system is embodied in a memory card device, Solid State Drive (SSD) device, ATA bus device, Serial ATA (SATA) bus device, Multi-Media Card (MMC) device, Secure Digital (SD) device, memory stick device, Hard Disk Drive (HDD) device, Hybrid Hard Drive (HHD) device, and/or a Universal Serial Bus (USB) flash drive device.

In still other embodiments, the memory system is embodied in a graphics card, a computer, a mobile terminal, a Personal Digital Assistant (PDA), a camera, a game console, an MP3 player, a television, a DVD player, a router, and/or a GPS system.

In further embodiments of the present invention, a memory system comprises a nonvolatile memory and a memory controller that is configured to detect a pattern in data to be written to a nonvolatile memory, to encode the data to be written to the nonvolatile memory based on the detected pattern, and to program the encoded data in the nonvolatile memory.

In still further embodiments, the memory controller comprises a local memory having a plurality of data patterns associated with a plurality of encoded data patterns, respectively, stored thereon and a pattern detector that is configured to match the pattern in the data to be written to the nonvolatile memory to one of the plurality of encoded data patterns.

In still further embodiments, the memory controller is further configured to select one of the plurality of encoded data patterns that is associated with the one of the plurality of data patterns that matches the pattern in the data to be written to the nonvolatile memory as the encoded data.

In still further embodiments, the memory system is embodied in a memory card device, Solid State Drive (SSD) device, ATA bus device, Serial ATA (SATA) bus device, Multi-Media Card (MMC) device, Secure Digital (SD) device, memory stick device, Hard Disk Drive (HDD) device, Hybrid Hard Drive (HHD) device, and/or a Universal Serial Bus (USB) flash drive device.

In still further embodiments, the memory system is embodied in a graphics card, a computer, a mobile terminal, a Personal Digital Assistant (PDA), a camera, a game console, an MP3 player, a television, a DVD player, a router, and/or a GPS system.

In still further embodiments of the present invention, a non-volatile memory system is operated by providing data to be written to a non-volatile memory and equalizing program stresses of cells in the non-volatile memory by changing the data to be written to the non-volatile memory and programming the changed data in the non-volatile memory.

Other systems, methods, and/or computer program products according to embodiments of the invention will be or become apparent to one with skill in the art upon review of the following drawings and detailed description. It is intended that all such additional systems, methods, and/or computer program products be included within this description, be within the scope of the present invention, and be protected by the accompanying claims.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF EMBODIMENTS

Figure 1:
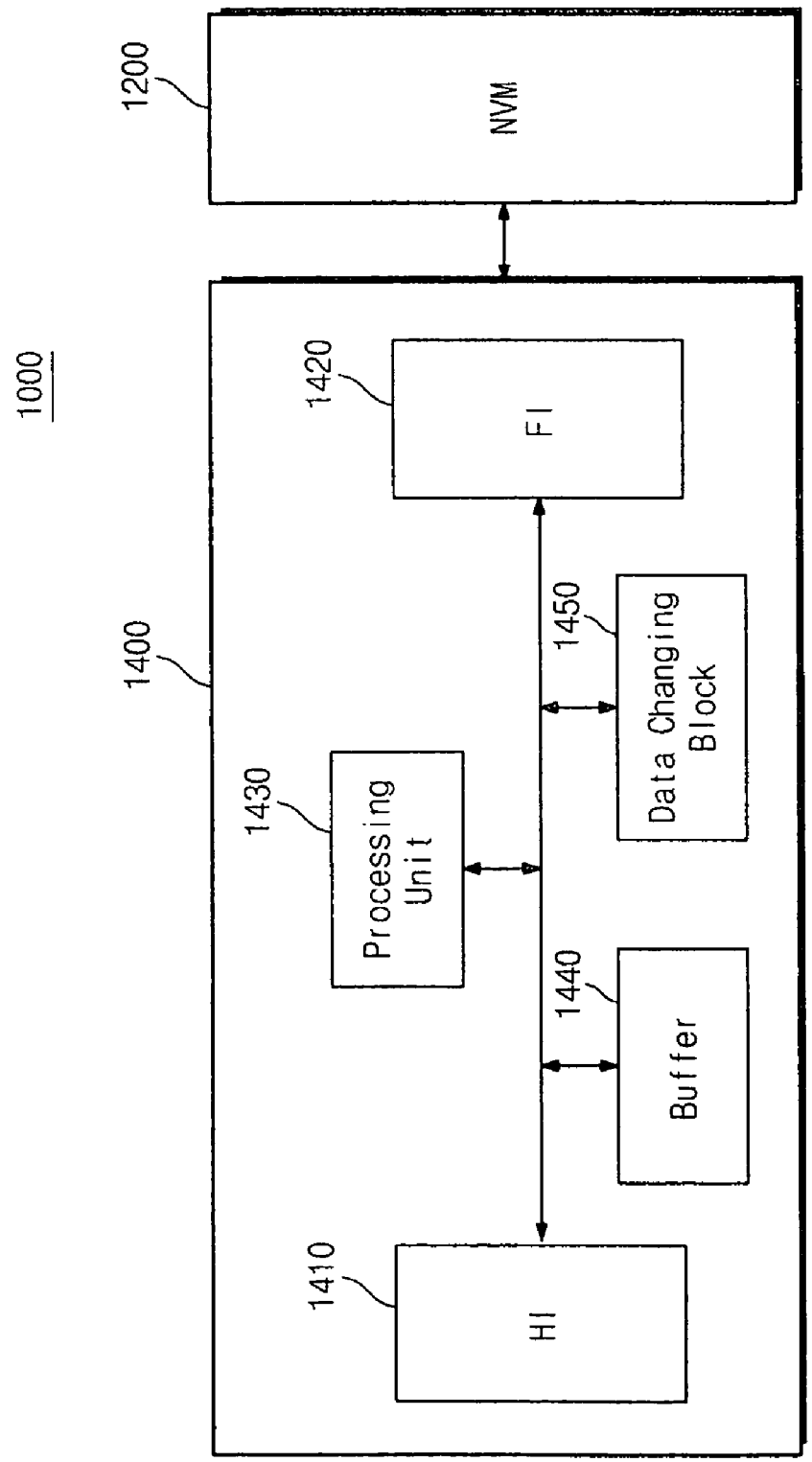
FIG. 1 is a block diagram of a memory system according to some embodiments of the present invention.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

As used herein, the singular forms "a," "an," and "the" are intended to include the plural forms as well, unless expressly stated otherwise. It should be further understood that the terms "comprises" and/or "comprising" when used in this specification is taken to specify the presence of stated features, integers, steps, operations, elements, and/or components, but does not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. Furthermore, "connected" or "coupled" as used herein may include wirelessly connected or coupled. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present invention may be embodied as methods, systems, and/or computer program products. Accordingly, the present invention may be embodied in hardware and/or in software (including firmware, resident software, micro-code, etc.). Furthermore, the present invention may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

For purposes of illustration, various embodiments of the present invention are described herein with reference to a nonvolatile memory comprising flash memory data storage device. It will be understood that the data storage device is not limited to implementation as a flash memory device, but can be implemented generally as an erase before write memory device. Thus, the data storage device may be a memory card device, Solid State Drive (SSD) device, ATA bus device, Serial ATA (SATA) bus device, Multi-Media Card (MMC) device, Secure Digital (SD) device, memory stick device, Hard Disk Drive (HDD) device, Hybrid Hard Drive (HHD) device, and/or a Universal Serial Bus (USB) flash drive device.

According to some embodiments of the present invention, a memory system that includes a memory controller and a nonvolatile memory can be operated by providing data to be written to the nonvolatile memory. The data to be written to the nonvolatile memory can be logically combined with a random pattern to generated encoded data. The encoded data can then be programmed in the nonvolatile memory. By encoding the data to be written to the nonvolatile memory, a more uniform distribution of memory locations can be programmed and erased so that the nonvolatile memory wears more evenly. In the case of Multi-Level Cell (MLC) flash memories, this may result in the threshold voltages for the various program states shifting more uniformly due to temperature and wear, which may improve the accuracy of the data read therefrom.

Referring now to FIG. 1, a memory system 1000, according to some embodiments of the present invention, includes a memory controller 1400 and nonvolatile memory 1200. The memory controller includes a host interface 1410, a flash interface 1420, a processing unit 1430, a buffer 1440, and a data changing block 1450 that are coupled by an address/data bus as shown. The processing unit 1430 may be, for example, a commercially available or custom microprocessor. The buffer 1440 is representative of the one or more local memory devices containing the software and data used to operate the memory controller 1400 in accordance with some embodiments of the present invention. The buffer 1440 may include, but is not limited to, the following types of devices: cache, ROM, PROM, EPROM, EEPROM, flash, SRAM, and DRAM.

The data changing block 1450 may be configured to encode data to be written to the nonvolatile memory 1200 and to decode data read from the nonvolatile memory 1200. The data changing block 1450 may perform its encoding/decoding operations using a random pattern that may be generated based on a reference value. In some embodiments, the reference value may be based on an Erase Counter Value (ECV). For example, each block in a flash memory may have an ECV associated therewith. When an erase operation is performed on the block, the ECV may be incremented. The nonvolatile memory 1200 may maintain the ECVs for the various memory blocks and provide them to the processing unit 1430 via the Flash Translation Layer (FTL) interface. The processing unit 1430 may provide the ECV values to the data changing block 1450 for use in encoding data to be programmed in the nonvolatile memory 1200 by storing the ECVs in the buffer 1440. The data changing block 1450 may be configured to encode data to be written to the nonvolatile memory 1200 to avoid writing the same data to the same memory locations repeatedly as this may result in undesirable shifts in threshold voltages used in reading flash memory cells.

Figure 2:
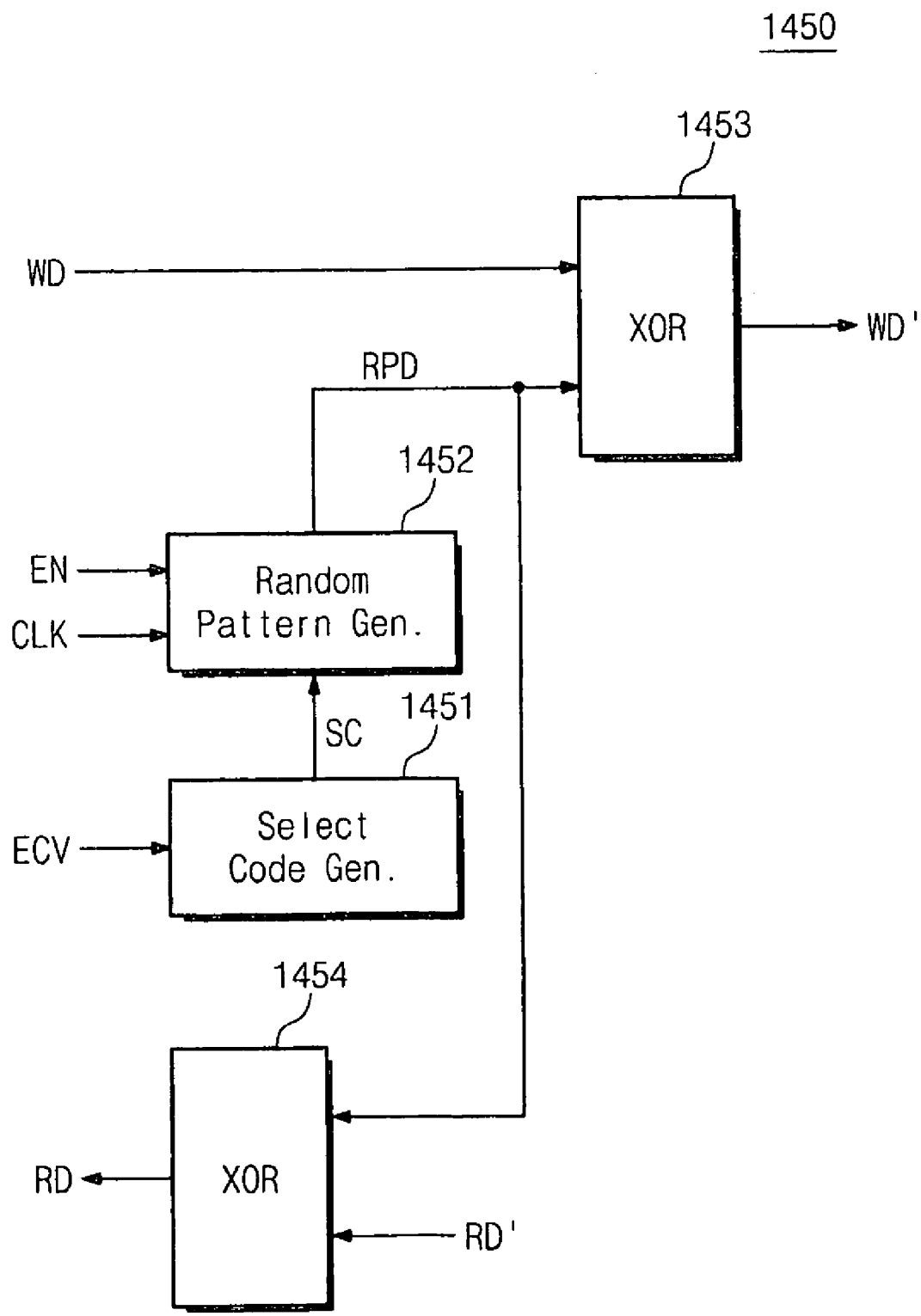
FIG. 2 is a block diagram of the data changing block of FIG. 1 according to some embodiments of the present invention.

FIG. 2 is a block diagram that illustrates a data changing block 1450 according to some embodiments of the present invention. The data changing block 1450 includes a select code generator 1451, a random pattern generator 1452, and exclusive-OR modules 1453 and 1454 that are configured as shown. Exemplary operations of the data changing block 1450 will now be described. The select code generator may be configured to generate a Select Code (SC) responsive to an ECV value for a block in which data is to be written into the nonvolatile memory 1200. The random pattern generator 1452 may be configured to generate Random Pattern Data (RPD) responsive to an enable signal (EN), a clock signal (CLK), and the SC. The exclusive-OR module 1453 may then generate encoded data (WD') to be written to the nonvolatile memory 1200 by performing an XOR operation on the unencoded data (WD) to be written to the nonvolatile memory 1200 and the RPD.

The RPD may change responsive to the period of the CLK. For example, the initial value of the RPD may be set based on SC to be "10." The RPD may then change to "10," "11," "0," and "01" repeatedly responsive to the CLK. The data to be written WD and the RPD may have the same number of bits. For example, if WD is "01010101" and RPD is "00001111," then the encoded data WD' to be programmed in the nonvolatile memory 1200 is "01011010."

When a read operation is performed the exclusive-OR module 1454 may perform an XOR operation on the encoded data RD' read from the nonvolatile memory 1200 and the RPD value used to encode the encoded data RD'. For example, unencoded data RD may be recovered by performing an XOR operation on RD' "01011010" with RPD "00001111" to obtain "01010101."

Figure 3A:
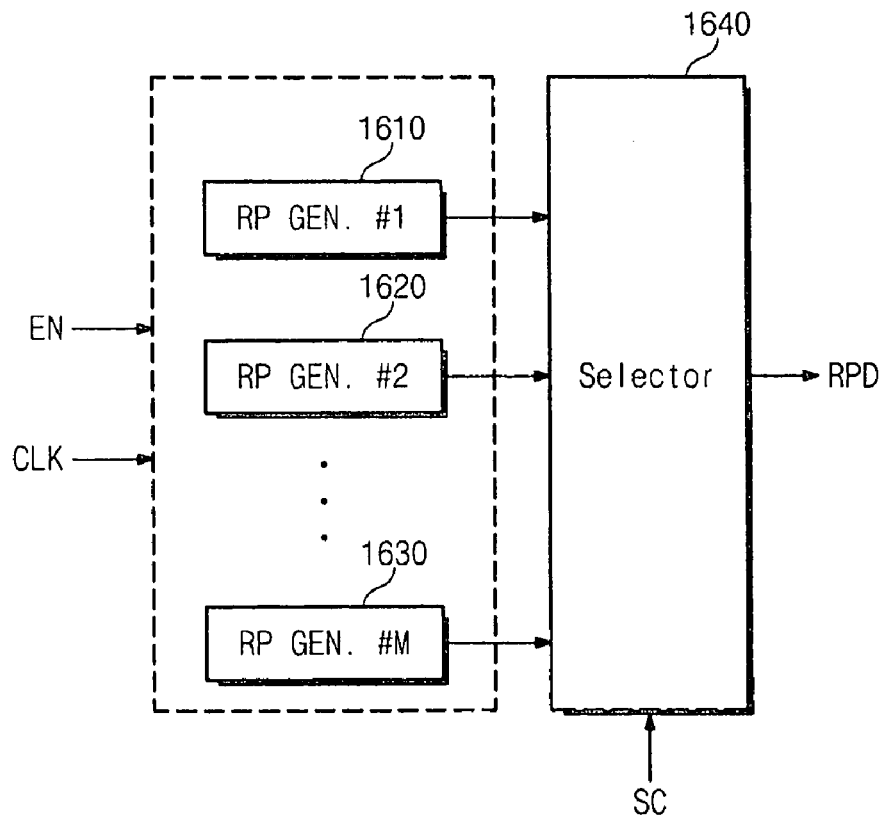
FIGS. 3A-3D are block diagrams of the random pattern generator of FIG. 2 according to various embodiments of the present invention.

The random pattern generator 1452 may be implemented in a variety of different ways in accordance with various embodiments of the present invention. Referring now to FIG. 3A, the random pattern generator 1452 may include a plurality of random pattern generators 1610, 1620, . . . 1630 that are responsive to the enable signal EN and the clock signal CLK. A selector module 1640 may be configured to select the output of one of the plurality of random pattern generators 1610, 1620, . . . 1630 as the RPD responsive to the SC value.

Figure 3B:
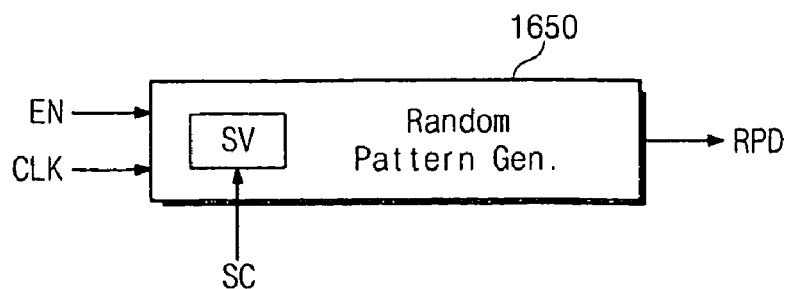

FIG. 3B illustrates the random pattern generator 1452 according to another embodiment of the present invention. Referring now to FIG. 3B, the random pattern generator 1452 includes a random pattern generator 1650 that generates the RPD based on a Seed Value (SV), which may be based on the SC value, and the enable signal EN and clock signal CLK.

Figure 3C:
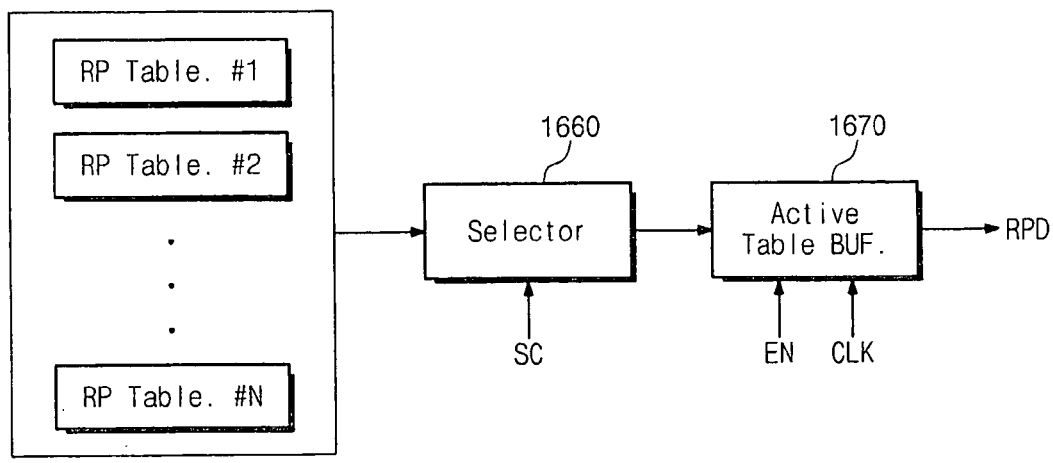

FIG. 3C illustrates the random pattern generator 1452 according to still another embodiment of the present invention. Referring now to FIG. 3C, the random pattern generator 1452 includes a plurality of random pattern tables stored in memory. A selector 1660 may be configured to select one of the random pattern tables responsive to the SC value. The selected random pattern table is stored in an active table buffer 1670, where entries therefrom are output as the RPD responsive to the enable signal EN and the clock signal CLK. The random pattern tables may be designed to encode particularly problematic patterns, such as MP3 headers, for example, rather than relying on the random nature of the RPD generated according to other embodiments of the present invention.

Figure 3D:
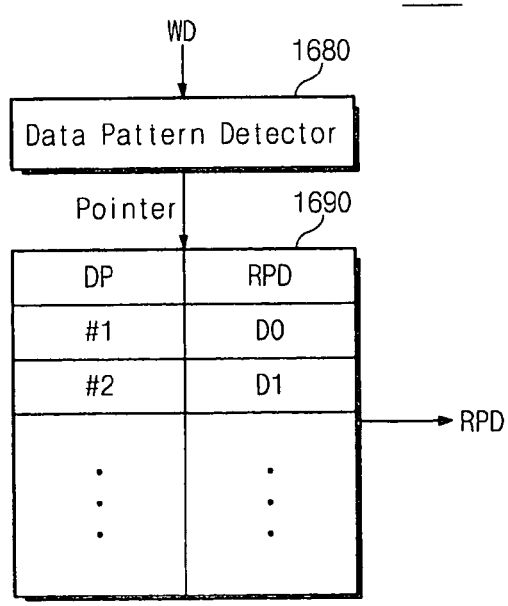

FIG. 3D illustrates the random pattern generator 1452 according to still another embodiment of the present invention. Referring to FIG. 3D, the random pattern generator 1452 includes a data pattern detector 1680, which may be configured to detect a pattern in the data to be written to the nonvolatile memory 1200. The detected pattern may be used as a pointer to index a table 1690 in which patterns in the data to be written are associated with particular RPD entries. The RPD entry that is associated with the detected pattern in the data to be written is output as the RPD.

Figure 4:
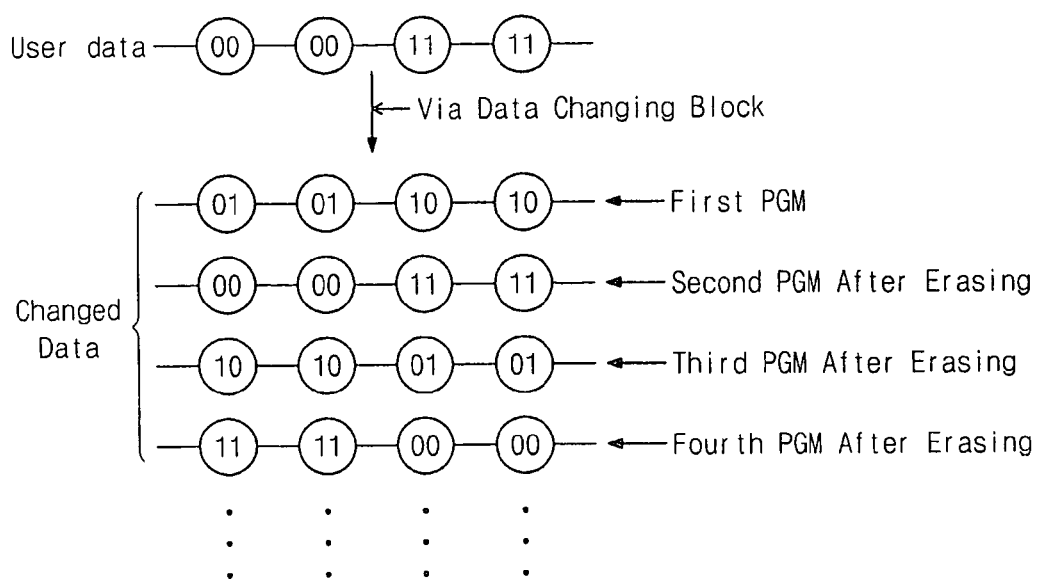
FIG. 4 illustrates the repeated programming of the same data pattern according to some embodiments of the present invention.

FIG. 4 illustrates the repeated programming of the same data pattern according to some embodiments of the present invention. As shown in FIG. 4, user data "0000111" is repeatedly programmed into the nonvolatile memory 1200. According to some embodiments of the present invention, however, rather than the same value "0000111" being programmed multiple times, the user data is encoded differently each time because the memory location is erased before each program operation resulting in a different random pattern being used to encode the user data. As shown, the user data is encoded as "01011010" for a first program operation, "00001111" for a second program operation after an erase operation has been performed, "10100101" for a third program operation after a second erase operation has been performed, and "11110000" for a four program operation after a third erase operation has been performed.

Figure 5A:
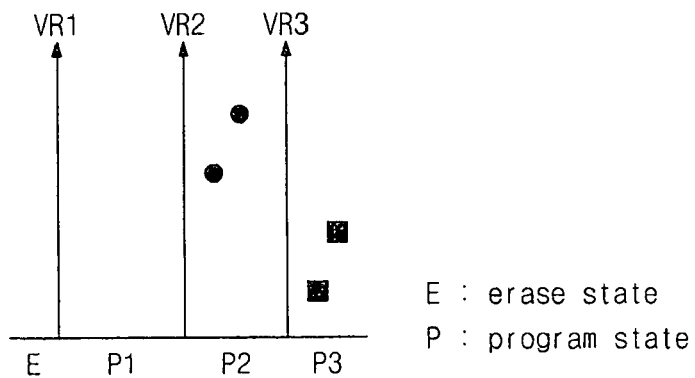
FIGS. 5A-5C illustrate a comparison of data retention concepts for conventional flash memory MLCs and flash memory MLCs according to some embodiments of the present invention.
Figure 5B:
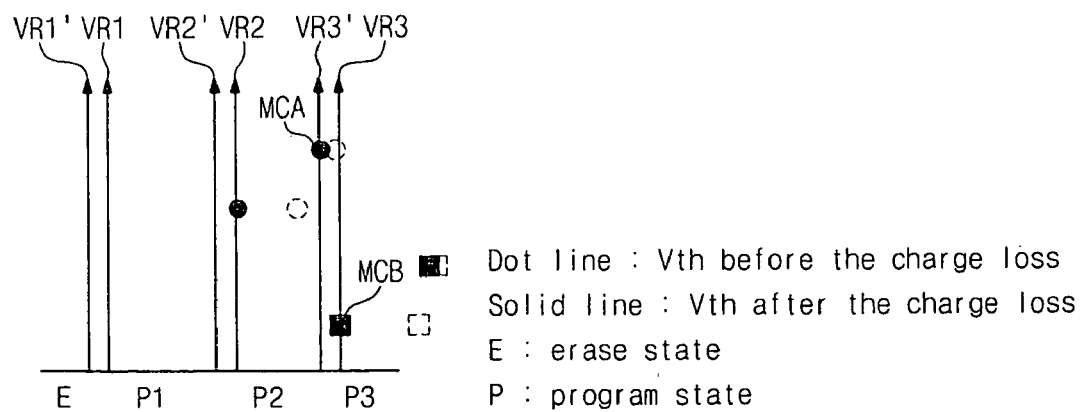
Figure 5C:
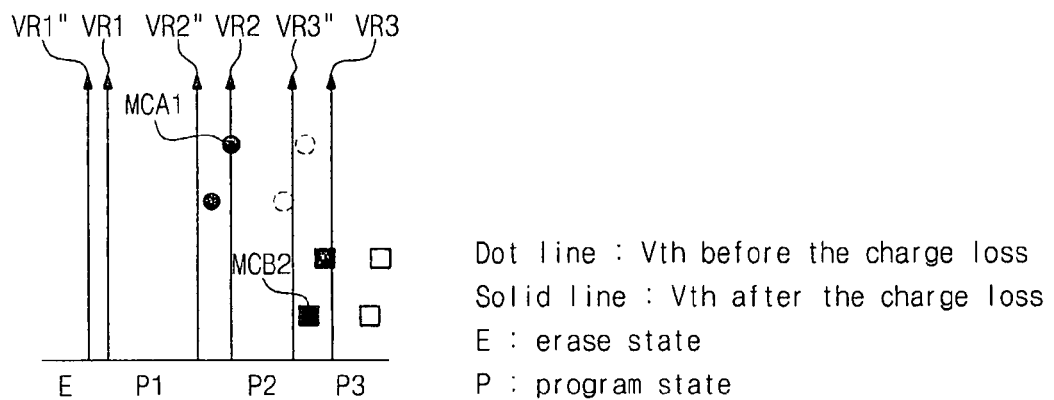

FIGS. 5A-5C illustrate a comparison of data retention concepts for conventional flash memory MLCs and flash memory MLCs according to some embodiments of the present invention. As shown in FIG. 5A, in a conventional flash memory, two cells are programmed in the P2 state (10) and two cells are programmed in the P3 state (00). As shown in FIG. 5B, however, due to program operations in the conventional flash memory over time the threshold voltages shift to the VR1', VR2', and VR3' levels. Moreover, due to charge loss, the memory cells shift as indicated by the solid icons. As a result, it may be difficult to determine the values associated with MCA and MCB. FIG. 5C the threshold voltages for MLCs in a flash memory according to some embodiments of the present invention. Because the memory cells are stressed similarly in terms of number of program/erase operations, the changes to the threshold voltages to detect the data in the MLCs is similar so that data stored therein may be read with improved reliability. Moreover, embodiments of the present invention may increase data retention time as compared to conventional flash memory systems.

The present invention is described hereinafter with reference to message flow, flowchart and/or block diagram illustrations of methods, systems, devices, and/or computer program products in accordance with some embodiments of the invention. These message flow, flowchart and/or block diagrams further illustrate exemplary operations for operating a data processing system that includes an external data storage device. It will be understood that each message/block of the message flow, flowchart and/or block diagram illustrations, and combinations of messages/blocks in the message flow, flowchart and/or block diagram illustrations, may be implemented by computer program instructions and/or hardware operations. These computer program instructions may be provided to a processor of a general purpose computer, a special purpose computer, or other programmable data processing apparatus to produce a machine, such that the instructions, which execute via the processor of the computer or other programmable data processing apparatus, create means for implementing the functions specified in the message flow, flowchart and/or block diagram block or blocks.

These computer program instructions may also be stored in a computer usable or computer-readable memory that may direct a computer or other programmable data processing apparatus to function in a particular manner, such that the instructions stored in the computer usable or computer-readable memory produce an article of manufacture including instructions that implement the function specified in the message flow, flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the message flow, flowchart and/or block diagram block or blocks.

Figure 6:
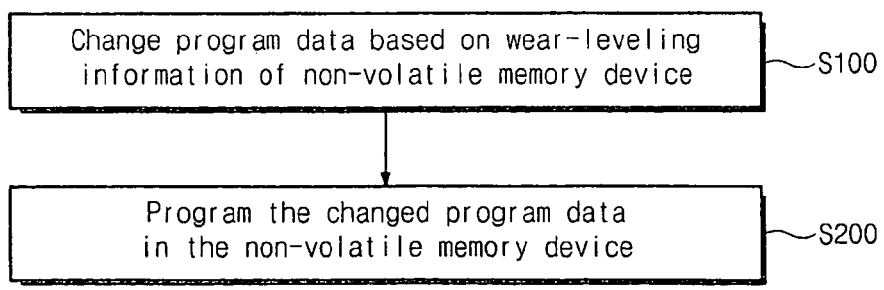
FIG. 6 is a flowchart that illustrates memory system operations in accordance with some embodiments of the present invention.

Referring to FIG. 6, operations begin at block S100 where program data is changed based on wear-leveling information associated with a non-volatile memory device. In some embodiments, the program data is changed by logically combining the data to be written to the nonvolatile memory with a random pattern to generate encoded data. At block S200, the changed/encoded program data are programmed in the non-volatile memory device.

Figure 7:
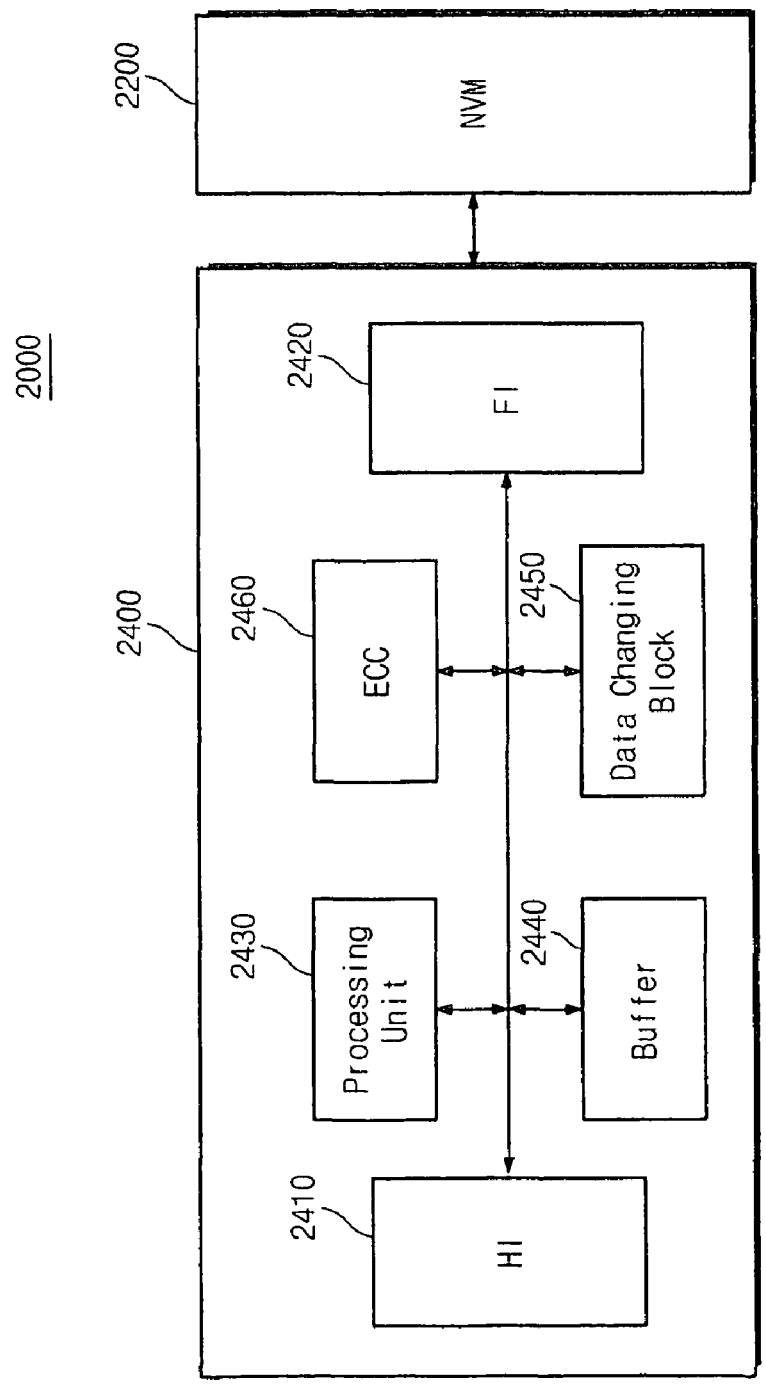
FIG. 7 is a block diagram of a memory system according to further embodiments of the present invention.

Referring now to FIG. 7, a memory system 2000, according to further embodiments of the present invention, includes a memory controller 2400 and nonvolatile memory 2200. The memory controller includes a host interface 2410, a flash interface 2420, a processing unit 2430, a buffer 2440, and a data changing block 2450 that are coupled by an address/data bus as shown. These various components are similar to their counterpart components described above with respect to FIG. 1. The memory controller 2400, however, includes an additional Error Correction Code (ECC) module 2460 that may be used to modify the data to be written to the nonvolatile memory 2200 with error correction data. Accordingly, in some embodiments of the present invention, the data to be encoded by the data changing block 2450 before being programmed in the nonvolatile memory 2200 may include error correction data.

Although FIGS. 1-7 illustrate memory system hardware/software architectures in accordance with some embodiments of the present invention, it will be understood that the present invention is not limited to such a configuration but is intended to encompass any configuration capable of carrying out operations described herein.

Computer program code for carrying out operations of devices and/or systems discussed above with respect to FIGS. 1-7 may be written in a high-level programming language, such as Java, C, and/or C++, for development convenience. In addition, computer program code for carrying out operations of embodiments of the present invention may also be written in other programming languages, such as, but not limited to, interpreted languages. Some modules or routines may be written in assembly language or even micro-code to enhance performance and/or memory usage. It will be further appreciated that the functionality of any or all of the program modules may also be implemented using discrete hardware components, one or more application specific integrated circuits (ASICs), or a programmed digital signal processor or microcontroller.

Figure 8:
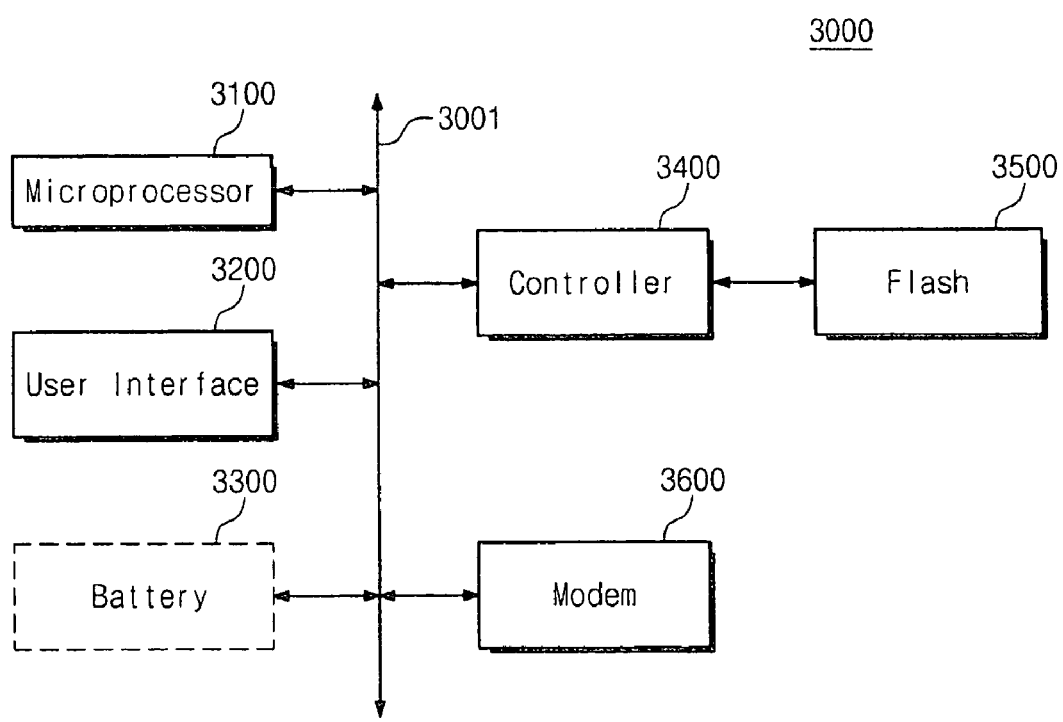
FIG. 8 is a block diagram of an electronic system that incorporates a memory system according to some embodiments of the present invention.

FIG. 8 illustrates an electronic system that incorporates a memory system in accordance with some embodiments of the present invention. As shown in FIG. 8, the electronic system 3000 may include a microprocessor 3100, user interface 3200, battery 3300, memory controller 3400, nonvolatile memory (e.g., flash memory) 3500, and modem 3600 that are coupled to each other via an address/data bus 3001. The controller 3400 and nonvolatile memory 3500 may be embodied as described above with respect to FIGS. 1-7. Thus, memory systems including the controller 3400 and nonvolatile memory 3500, according to some embodiments of the present invention, may be embodied in electronic systems 3000, such as, but not limited to, a graphics card, a computer, a mobile terminal, a Personal Digital Assistant (PDA), a camera, a game console, an MP3 player, a television, a DVD player, a router, and/or a GPS system.

Figure 9:
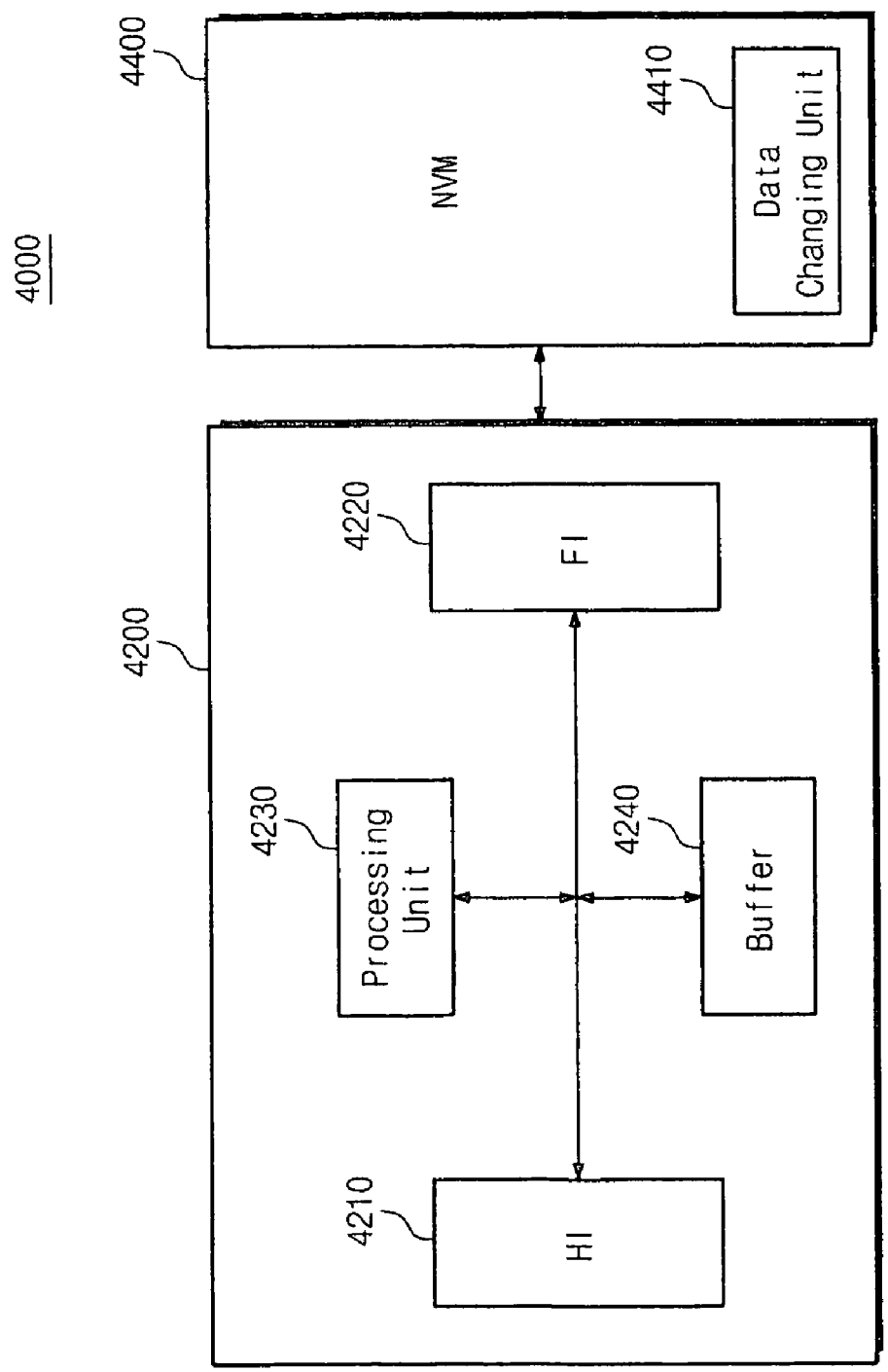
FIG. 9 is block diagram of a memory system according to further embodiments of the present invention.

FIG. 9 illustrates a memory system according to further embodiments of the present invention.

A memory system 4000 illustrated in FIG. 9, according to some embodiments of the present invention, may include a memory controller 4200 and a non-volatile memory device 4400. The memory controller 4200 may include a host interface 4210, a flash interface 4220, a processing unit 4230, and a buffer memory 4240.

The host interface 4210 may be configured to interface with an external device according to a given interface protocol and the flash interface 4220 may be configured to interface with the non-volatile memory device 4400 according to a given interface protocol. The processing unit 4230 may control overall operations of the memory controller 4200. The buffer memory 4240 may be used to store write data (or, referred to as program data) provided from the external device or data read out from the non-volatile memory device 4400. Further, the buffer memory 4240 may be used to store erase count information (or, wear-leveling information) read out from the non-volatile memory device 4400 as a seed value.

Continuing to refer to FIG. 9, the non-volatile memory device 4400, although not show in FIG. 9, may include a memory cell array having memory cells (or, non-volatile memory cells) arranged in rows and columns. The non-volatile memory device 4400 may further include a data changing unit 4410, which is described above. That is, the data changing unit 4410 may be provided not in the memory controller 4200, but in the non-volatile memory device 4400. The data changing unit 4410 may change data to be stored in the memory cell array and restore data read out from the memory cell array into original data.

Figure 10:
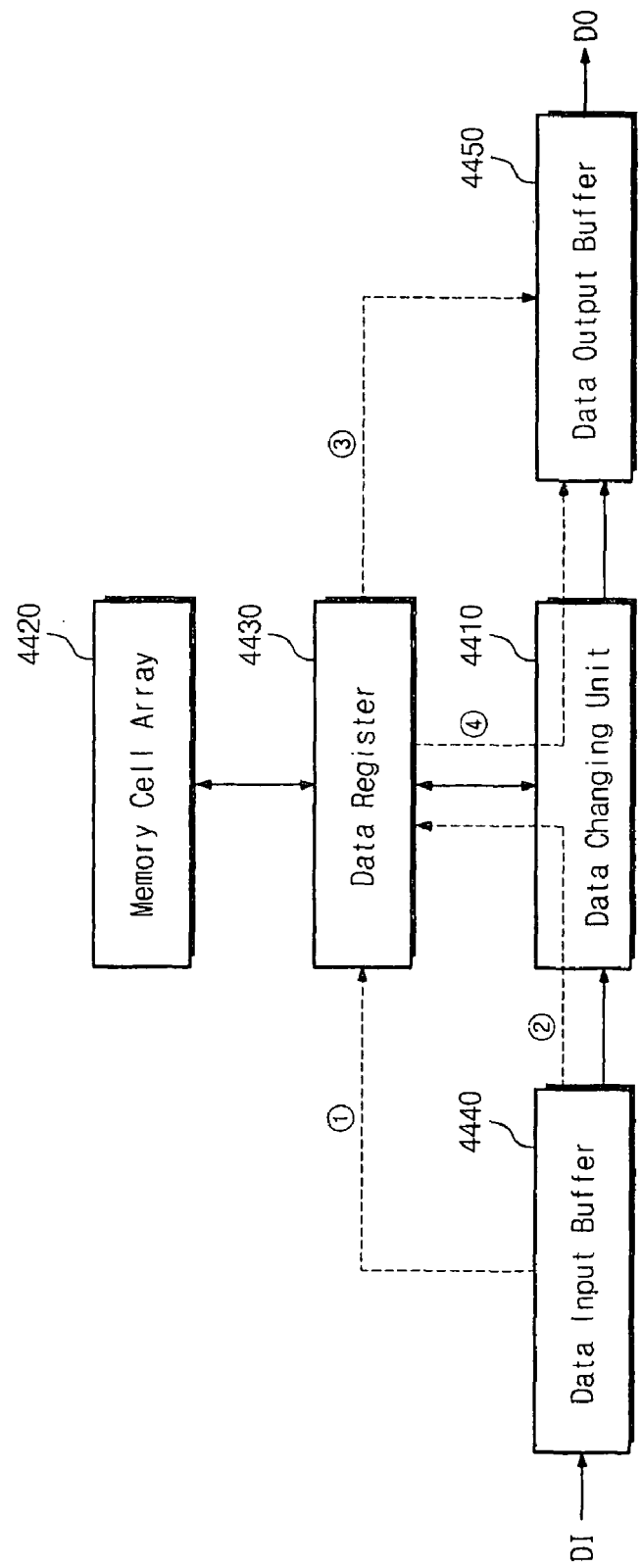
FIG. 10 is a block diagram of the memory device of FIG. 9.

FIG. 10 is a block diagram showing a non-volatile memory device illustrated in FIG. 9.

Referring to FIG. 10, a non-volatile memory device 4400 may include a data changing unit 4410, a memory cell array 4420, a data register 4430, a data input buffer 4440, and a data output buffer 4450.

The data changing unit 4410 may be made of one of the above-described embodiments. For example, the data changing unit 4410 may be formed to generate random pattern data using an erase count value as a seed value. In this case, the seed value may be provided to the data changing unit 4410 from a memory controller 4200 before a write/read operation. The data changing unit 4410 may change input data DI provided via the input data buffer 4440 based upon the seed value (or, the erase count value). The data register 4430 may store data provided via the data changing unit 4410, that is, changed data in the memory cell array 4420. The data register 4430 may read data from the memory cell array 4420 and output the read-out data to the data changing unit 4410. The data changing unit 4410 may restore data provided from the data register 4430 to original data based upon the seed value (or, the erase count value) and output it to the external (i.e., a memory controller) via the data output buffer 4450.

Data DI provided externally is able to be sent directly to the data register 4430 via a data path ①  without going via the data changing unit 4410. Alternatively, data DI provided externally is able to be sent to the data register 4430 via a bypass path ② of the data changing unit 4410. In this case, the data changing unit 4410 may be configured such that input data DI is transferred without any change made thereto. Data read by the data register 4430 is able to be sent directly to the data output buffer 4450 via a data path ③ without going via the data changing unit 4410. Alternatively, data read by the data register 4430 is able to be transferred to the data output buffer 4450 via a bypass path ④ of the data changing unit 4410. In this case, the data changing unit 4410 may be configured such that read data is transferred without any change made thereto.

Figure 11:
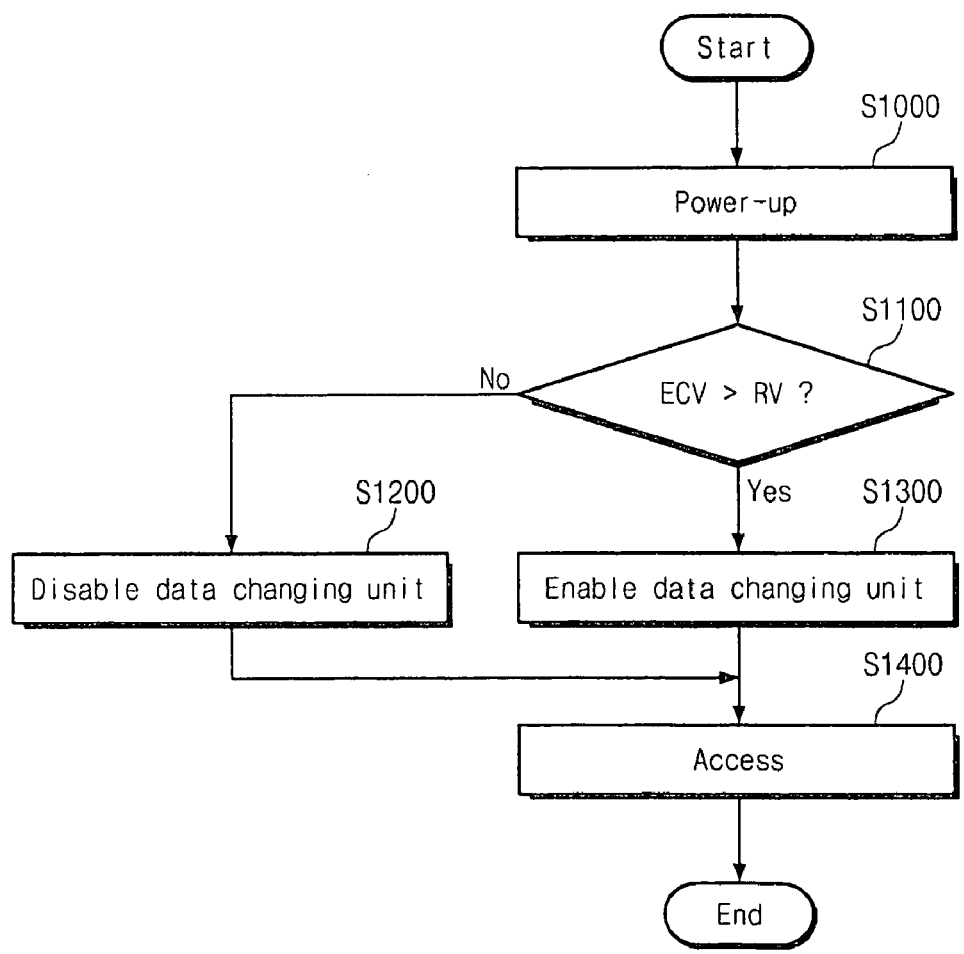
FIG. 11 is a flowchart that illustrates operations of the memory system of FIG. 10 according to some embodiments of the present invention.

FIG. 11 is a flow chart for describing operations of a memory system according to exemplary embodiments of the present invention. A data changing operation of a memory system according to the present invention can be performed selectively. For example, the data changing operation may be carried out only when a condition of a memory system, that is, a non-volatile memory device satisfies a specific condition. Exemplary embodiments will be more fully described below.

At block S1000, power is supplied to a memory system. After power-up, at block S1100, the memory system may determine whether an erase count value ECV is more than a reference value RV. This determination may be conducted by a processing unit 1430/2450/4230. If the erase count value ECV is determined to be less than the reference value RV, at block S1200, a data changing unit may be inactivated according to the control of the processing unit. If the erase count value ECV is determined to be more than the reference value RV, at block S1300, a data changing unit may be inactivated according to the control of the processing unit. Afterwards, access to the non-volatile memory device may be made based upon an external operation request.

As described in FIG. 11, if the data changing operation is selectively conducted, a data changing unit 1450 illustrated in FIG. 1 may be configured to perform a bypass function where data is transferred without any change made thereto.

Figure 12:
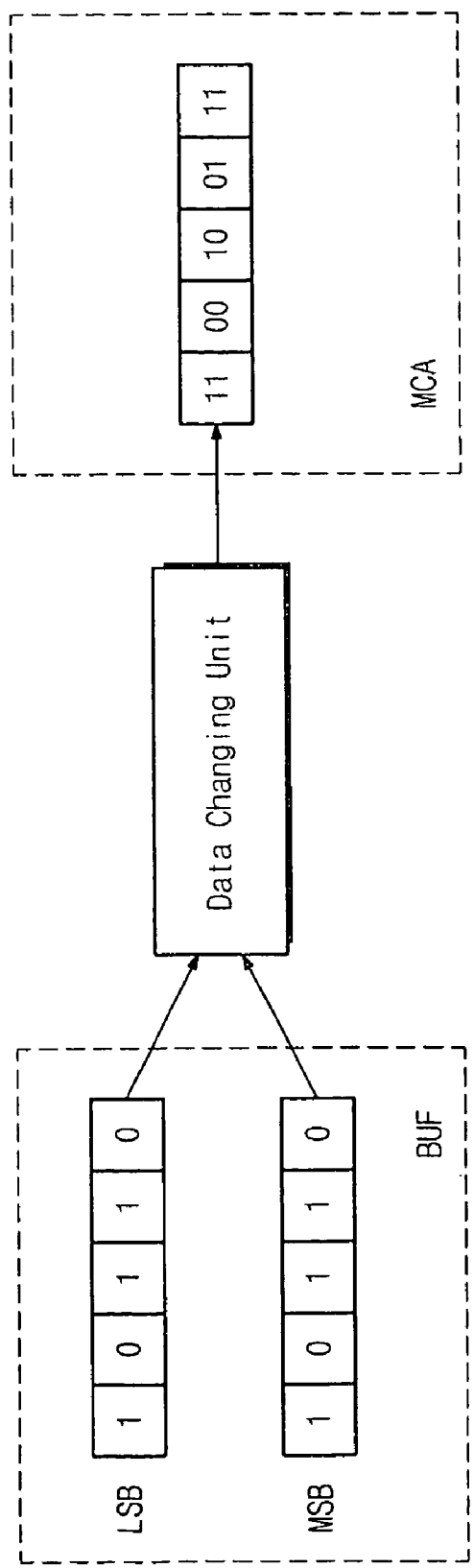
FIG. 12 is a block diagram that illustrates operations of a data changing unit according to some embodiments of the present invention.

FIG. 12 is a block diagram showing a memory system according to further exemplary embodiments of the present invention.

Not 1-bit data, but only N-bit data (hereinafter, referred to as multi-bit data) (N being an integer greater than or equal to 2) is able to be stored in each memory cell. When multi-bit data is stored in memory cells, a data changing operation according to the present invention will be conducted as follows. For ease of description, it is assumed that 2-bit data is stored in each memory cell.

Multi-bit data may be formed of LSB data and MSB data. LSB data to be stored in a memory cell array MCA may be stored in a buffer memory BUF of a memory system. The LSB data may be stored in the buffer memory BUF until a write operation for MSB data is requested. When a write operation for MSB data is requested, that is, if MSB data is stored in the buffer memory BUF, LSB and MSB data is simultaneously changed via a data changing unit, and the changed data is stored in the memory cell array MCA. The LSB and MSB data may be changed via the data changing unit by considering the stress or cell distribution of a memory cell determined when the LSB and MSB data is stored in the memory cell.

If 4-bit data is stored in each memory cell, the lower 2-bit data is stored simultaneously in the memory cell array MCA according to the manner described in FIG. 12, and then the upper 2-bit data is stored simultaneously in the memory cell array MCA according to the manner described in FIG. 12.

Figure 13A:
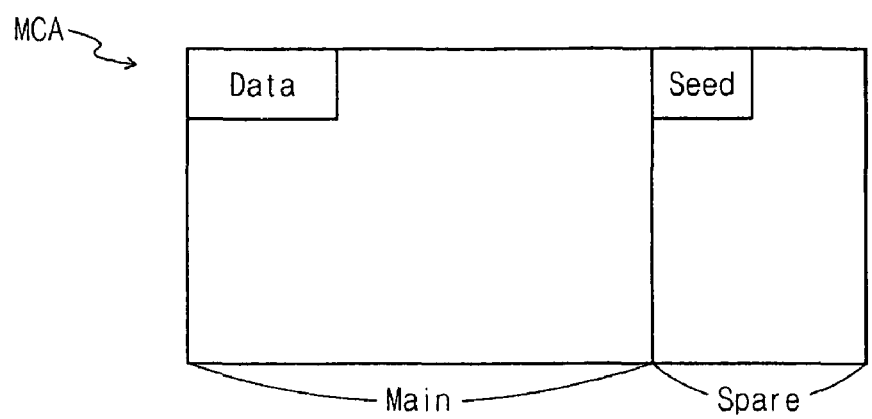
FIGS. 13A and 13B are block diagrams that illustrate storage of a reference value used in changing data to be written to a memory device according to some embodiments of the present invention.
Figure 13B:
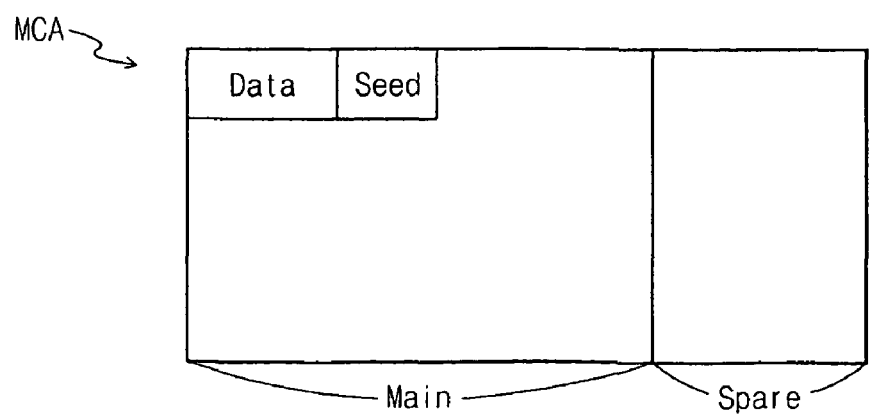

In a memory system according to the present invention, random pattern data is able to be generated using a specific seed value instead of wear-leveling information (i.e., an erase count value). Such specific seed value may be stored in a non-volatile memory device. The specific seed value may be stored in the non-volatile memory device via various manners. For example, as illustrated in FIG. 13A, a specific seed value is stored in a spare region of a memory cell array MCA, and changed data is stored in a main region. Alternatively, as illustrated in FIG. 13B, a specific seed value is able to be stored in a main region of a memory cell array MCA together with changed data.

In an exemplary embodiment, a data changing function of a memory system, according to the present invention, is able to be used only to manage weak cells. In other words, when an error arises with regard to any memory cells (corresponding to one page or one memory block) at a read/program operation, the data changing function may be applied only to erroneous memory cells. Information for memory cells to which the data changing function is applied may be managed by a processing unit and stored in a non-volatile memory device.

In an exemplary embodiment, a seed value may be changed whenever an erase operation is performed. But, changing of a seed value is not limited thereto. For example, a seed value is able to be changed whenever a read operation is carried out. It is possible to manage a read count value of any memory block and use the read count value as a seed value. In this case, a read count value may be managed under the control of a processing unit and temporarily stored in a buffer memory. A read count value stored in a buffer memory may be stored periodically in any region (e.g., a meta region) of a non-volatile memory device. A read count value stored in the buffer memory may be destroyed when power is suddenly cut. This means that a read count value stored in the non-volatile memory device is different from the destroyed read count value stored in the buffer memory. A read count value stored in the non-volatile memory device may be compensated via the following method.

Figure 14:
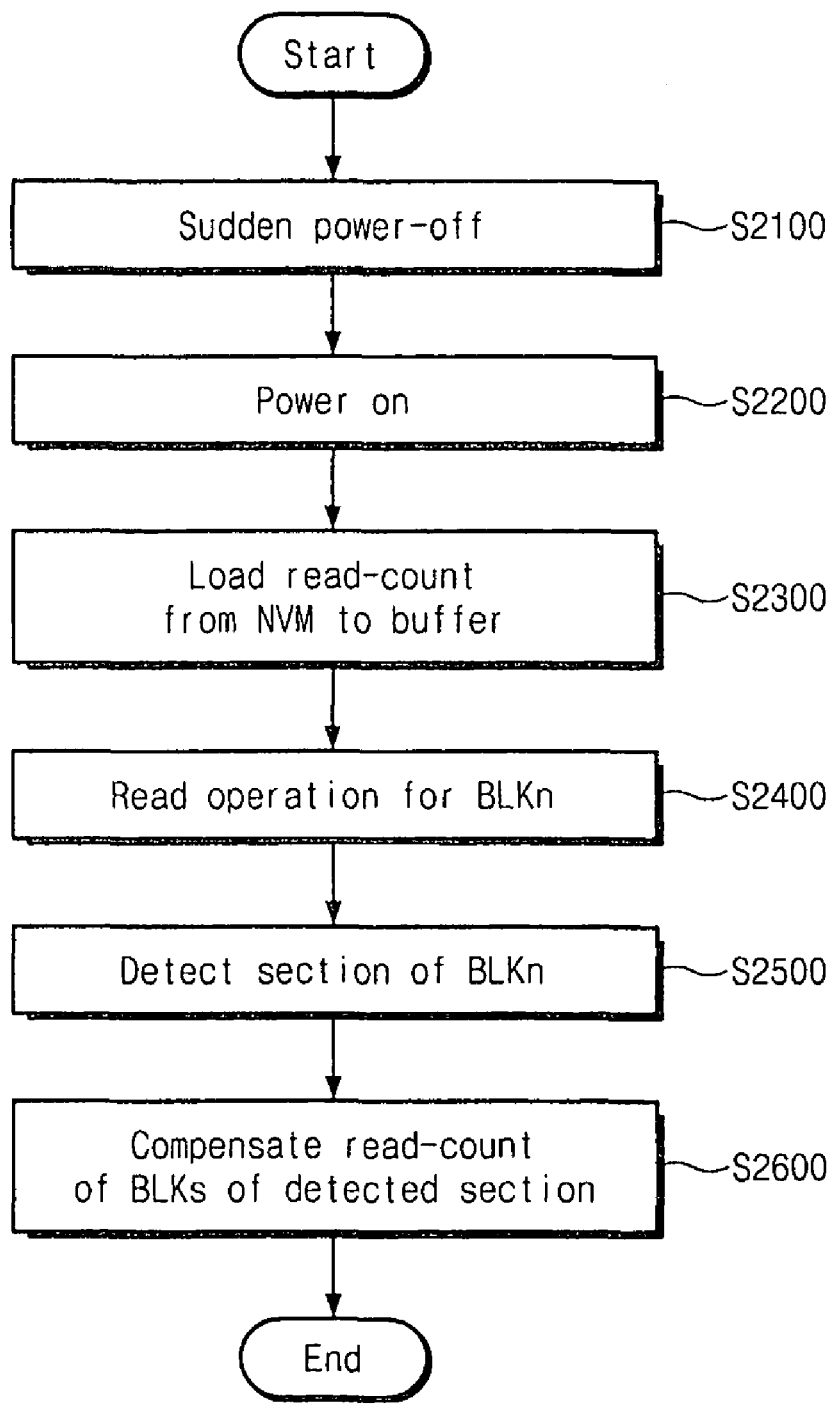
FIG. 14 is flowchart that illustrates compensating for a reference value used in changing data to be written to a memory device in the event of a sudden power-off of the memory device according to some embodiments of the present invention.

FIG. 14 is a flow chart for illustrating a method of compensating for the read count data if a sudden power-off occurs.

At block S2100, it is assumed that during an operation of the memory system a sudden power-off occurs in the memory system. If the sudden power-off occurs, the non-volatile memory device retains data but a buffer memory loses data stored therein. Thus, when the sudden power-off occurs, the read count data stored in the buffer memory is lost while the read count data stored in the non-volatile memory device is maintained.

In an initializing operation of the memory system, the read count data stored in the non-volatile memory device is loaded into the buffer memory. Whenever conducting the reading operation of the non-volatile memory device, the read count data stored in the buffer memory increases.

Otherwise the read count data stored in the non-volatile memory device is updated only by an additional flash programming operation. Thus, since the read count data stored in the buffer memory is lost if the sudden power-off occurs, there is no way of learning the read count data corresponding to the sudden power-off time. The memory system according to some embodiments of the present invention is provided with a method capable of compensating the read count data when the sudden power-off occurs.

At block S2200, the memory system is powered on again. Here, a power-on operation is an initializing operation activated after the sudden power-off. At block S2300, the read count data is loaded into the buffer memory from the non-volatile memory device.

At block S2400, the reading operation is carried out to a memory block. At block S2500, it detects a section including the memory block. Here, the section includes pluralities of the memory blocks (e.g., four memory blocks BLK1~BLK4).

At block S2600, the memory system compensates for the read count data of all the memory blocks included in the detected section. For instance, it is assumed that the flash programming cycle of the read count data is 100, the detected section is the first section, and the read count data before compensating for the memory blocks BLK1~BLK4 is as shown in Table 1.

TABLE 1

| Section | Block | Read count before compensation | Read count after compensation |
|---|---|---|---|
| 1 | BLK1 | 120 | (120 + 50) |
| | BLK2 | 319 | (319 + 50) |
| | BLK3 | 418 | (418 + 50) |
| | BLK4 | 502 | (502 + 50) |

In Table 1, a compensation value of the read count data is set to 50 that is an intermediate value of the flash programming cycle 100. The read count data after compensation are set to 170, 369, 468, and 552, respectively. But the compensation value of the read count data may be set to another value within the range of the flash programming cycle according to further embodiments of the present invention.

In exemplary embodiments, a method of compensating the read count value is able to be applied to an erase count value.

Herein, the flash program cycle indicates a cycle where read count data stored in a buffer memory is periodically programmed in a non-volatile memory device. For example, in a case where a program cycle is 100, a memory system updates read count data to a non-volatile memory device whenever read count data reaches 100, 200, 300, and so on. In a case where a program cycle is 1000, a memory system updates read count data to a non-volatile memory device whenever read count data reaches 1000, 2000, 3000, and so on.

Figure 15A:
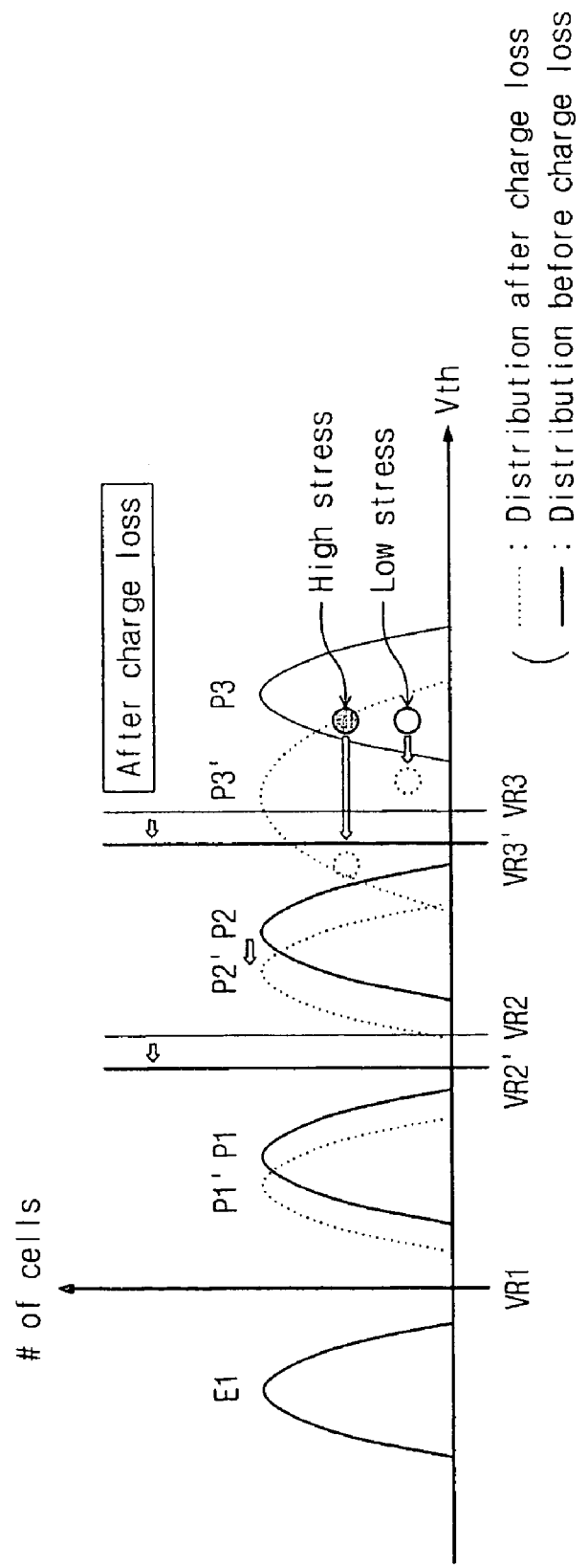
FIGS. 15A and 15B illustrate threshold voltage distribution examples for cases when a data changing function is not used and when a data changing function is used according to some embodiments of the present invention.
Figure 15B:
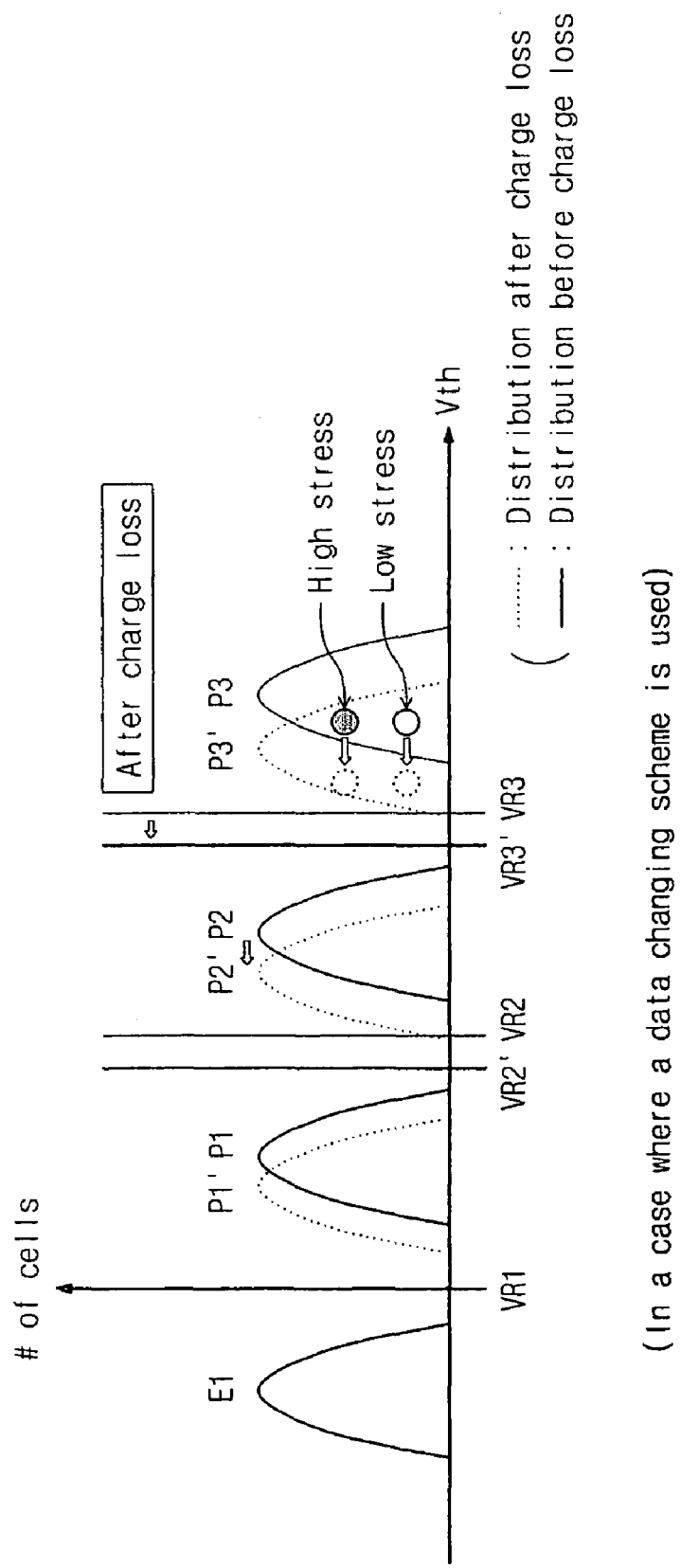

In a case where the above-described data changing function is applied to a memory system, it is possible to prevent or reduce the likelihood of a threshold voltage distribution from being widened due to program stress or charge loss. For example, in a case where a data changing function is not used, as illustrated in FIG. 15A, a threshold voltage distribution P3 may be widened like a threshold voltage distribution P3' to be close to or overlapped with an adjacent threshold voltage distribution P2 after charge loss. On the other hand, in the case that a data changing function according to the present invention is used, as illustrated in FIG. 15B, a threshold voltage distribution P3 may be changed like a threshold voltage distribution P3' so as not to be overlapped with an adjacent threshold voltage distribution P2 after the charge loss. In other words, if the data changing function according to the present invention is used, threshold voltage distributions may be more uniformly maintained although charge loss occurs. This means that each threshold voltage distribution becomes more uniform by equalizing the program stress forced to each memory cell. Further, threshold voltage distributions of memory cells in each memory block become more uniform by equalizing the program stress forced to each memory cell. Further, equalization of the program stress obtained to randomly change program data may enable '0' and '1' bits to be written uniformly to each memory cells. As bits written in each memory cell become uniform, coupling between adjacent memory cells may be reduced.

Figure 16A:
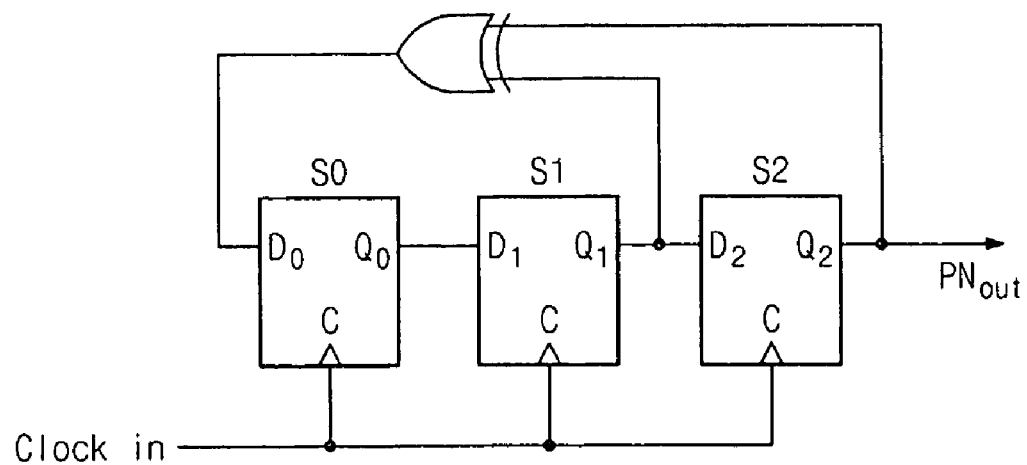
FIGS. 16A, 16B, and 16C are block diagrams that illustrate a sequence generator, linear feedback shift register, and CRC generator/checker, respectively, according to some embodiments of the present invention.
Figure 16B:
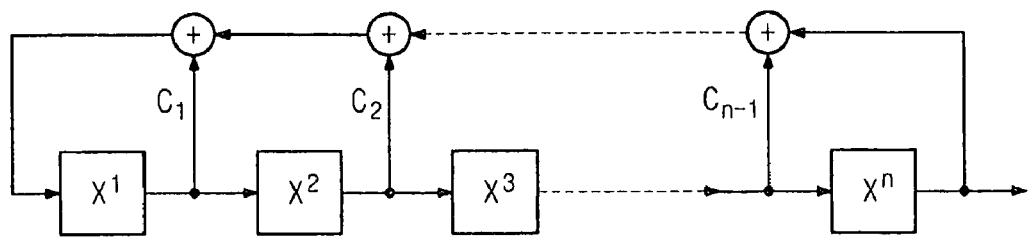
Figure 16B:
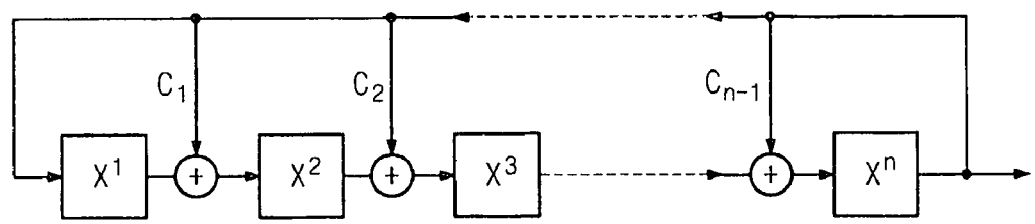
Figure 16C:
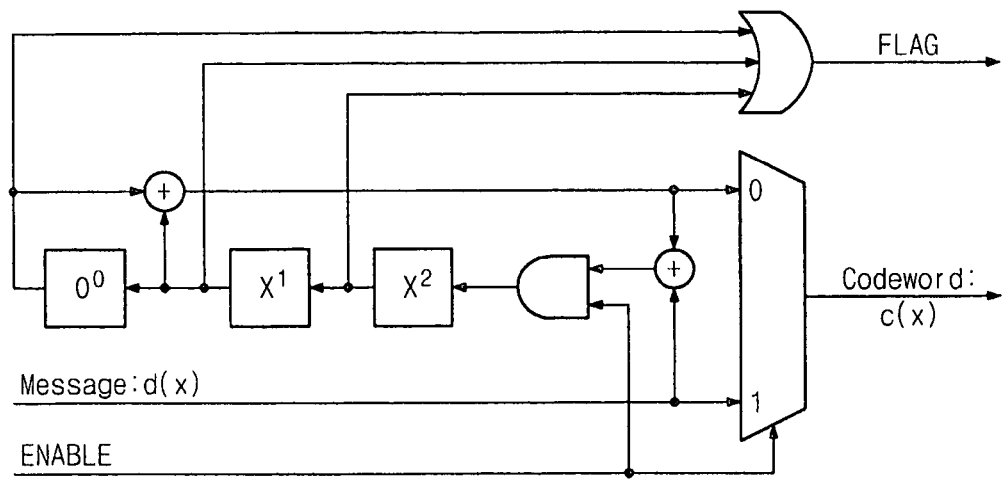

In a memory system according to the present invention, it is possible to generate random pattern data using a PN sequence generator, a Linear Feedback Shift Register (LFSR), a CRC generator/checker, or the like. Exemplary embodiments of the PN sequence generator, Linear Feedback Shift Register (LFSR), and the CRC generator/checker are illustrated in FIGS. 16A, 16B, and 16C, respectively. Operations of the exemplary embodiments illustrated in FIG. 16A to FIG. 16C are generally well known in the art and description thereof is thus omitted.

Many variations and modifications can be made to the embodiments without substantially departing from the principles of the present invention. All such variations and modifications are intended to be included herein within the scope of the present invention, as set forth in the following claims.

That which is claimed:

1. A memory system comprising:
a nonvolatile memory; and
a memory controller that is configured to logically combine data to be written to the nonvolatile memory with a random pattern to generate encoded data and to program the encoded data in the nonvolatile memory, the memory controller comprising:
a select code generator that is configured to generate a select code based on a reference value, the reference value being associated with a block in the nonvolatile memory into which the encoded data is programmed;
a buffer memory;
a plurality of random pattern generators; and
a selector that is configured to select an output of one of the random pattern generators as the random pattern responsive to the select code;
wherein the memory controller is further configured to change the reference value when the block in the nonvolatile memory that is associated therewith is accessed; and
wherein the memory controller is further configured to manage the reference value in the buffer memory, periodically store the reference value managed in the buffer memory to the nonvolatile memory, read the reference value from the nonvolatile memory after a sudden power off, and to compensate the read reference value after the sudden power off.

2. The memory system of claim 1, wherein the reference value is an erase count value.

3. The memory system of claim 1, wherein the memory controller is further configured to read the encoded data from the nonvolatile memory and to decode the encoded data using the random pattern.

4. The memory system of claim 3, wherein the memory controller is further configured to decode the encoded data by logically combining the encoded data with the random pattern.

5. The memory system of claim 4, wherein the memory controller is further configured to logically combine the data to be written to the nonvolatile memory with a random pattern by performing an exclusive-OR operation on the data to be written to the nonvolatile memory and the random pattern and to logically combine the encoded data with the random pattern by performing an exclusive-OR operation on the encoded data and the random pattern.

6. The memory system of claim 1, wherein the data to be written to the nonvolatile memory comprises error correction data.

7. The memory system of claim 1, wherein the reference value is a read count value.

8. A method of operating a non-volatile memory system, comprising:
   providing data to be written to a non-volatile memory;
   generating a plurality of random patterns;
   generating a select code based on a reference value;
   combining the data to be written to the non-volatile memory with a random pattern, which is selected from the plurality of random patterns based on the select code and programming the combined data in the non-volatile memory, the reference value being associated with a block in the non-volatile memory into which the combined data is programmed; and
   changing the reference value when the block in the non-volatile memory that is associated therewith is accessed;
   wherein the reference value is periodically stored to the nonvolatile memory, read from the nonvolatile memory after a sudden power off and compensated according to the reading after the sudden power off.

9. The method of claim 8, wherein the reference value is an erase count value.

10. The method of claim 8, wherein the reference value and the changed data are stored in separate regions in the nonvolatile memory.

11. The method of claim 8, wherein the reference value and the changed data are stored in a same region in the nonvolatile memory.

12. The method of claim 8 wherein combining the data to be written with the random pattern and programming the combined data comprises:
   combining the data to be written when a data change condition is satisfied.

13. The method of claim 12, wherein the data change condition is an erase count value associated with a block in the nonvolatile memory into which the combined data is programmed exceeds an erase count threshold.

14. The method of claim 8, wherein each cell of the nonvolatile memory is configured to store N-bit data, where N is greater than one, wherein changing the data to be written comprises:
   changing a most significant bit (MSB) portion of the data; and
   changing a least significant bit (LSB) portion of the data.

15. The method of claim 8, wherein combining the data to be written with the random pattern and programming the combined data comprises:
   combining the data to be written when a read or program error has occurred in a block in the nonvolatile memory into which the combined data is to be programmed.

16. The method of claim 8, wherein the reference value is a read count value.

17. A non-volatile memory, comprising:
   a data changing unit that is configured to receive data to be written to the non-volatile memory, to generate a plurality of random patterns, to generate a select code based on a reference value, to select a random pattern from the plurality of random patterns based on the select code, to combine the data to be written to the non-volatile memory with the selected random pattern, and to program the combined data in the non-volatile memory;
   wherein the reference value is associated with a block in the non-volatile memory into which the combined data is programmed and wherein the data changing unit is further configured to change the reference value when the block in the non-volatile memory that is associated therewith is accessed;
   wherein the reference value is periodically stored to nonvolatile memory cells, read from the nonvolatile memory cells after a sudden power off, and compensated according to the reading after the sudden power off.

18. The nonvolatile memory of claim 17, wherein the reference value is a read count value.

* * * * *